US012696652B2

(12) United States Patent
Kim et al.

(10) Patent No.: US 12,696,652 B2
(45) Date of Patent: Jul. 28, 2026

(54) DISPLAY DEVICE

(71) Applicant: LG DISPLAY CO., LTD., Seoul (KR)

(72) Inventors: Minhyung Kim, Seoul (KR);
Kyeongjin Kim, Paju-si (KR); Musun Kwak, Goyang-si (KR); Daejung Choi, Goyang-si (KR); Shin-Bok Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 708 days.

(21) Appl. No.: 17/897,488

(22) Filed: Aug. 29, 2022

(65) Prior Publication Data

US 2023/0209968 A1     Jun. 29, 2023

(30) Foreign Application Priority Data

Dec. 24, 2021     (KR) ........................ 10-2021-0187794

(51) Int. Cl.
*H01L 27/32*     (2006.01)
*G06F 3/044*     (2006.01)
*H10K 50/86*     (2023.01)
*H10K 59/40*     (2023.01)
*H10K 59/60*     (2023.01)

(52) U.S. Cl.
CPC ........... *H10K 59/60* (2023.02); *G06F 3/0446* (2019.05); *H10K 50/865* (2023.02); *H10K 59/40* (2023.02); *G06F 2203/04112* (2013.01)

(58) Field of Classification Search
CPC ...... H10K 59/60; H10K 50/865; H10K 59/40; H10K 85/50; H10K 30/10; H10K 39/10;
G06F 3/0446; G06F 2203/04112; G06F 2203/04103; G06F 3/0412; G06F 3/042; G06F 3/0443; C08G 64/186; C08G 64/305
See application file for complete search history.

(56) References Cited

U.S. PATENT DOCUMENTS 9,614,013 B2     4/2017   Im et al.
2009/0009675 A1   1/2009   Cho et al.
(Continued)

FOREIGN PATENT DOCUMENTS

CN     101727786 A     6/2010
CN     101787272 A     7/2010
(Continued)

OTHER PUBLICATIONS

Office Action in Korean Appln. No. 20210187794, mailed on Dec. 16, 2024, 10 pages (with English translation).
(Continued)

*Primary Examiner* — Ermias T Woldegeorgis
(74) *Attorney, Agent, or Firm* — Fish & Richardson P.C.

(57) ABSTRACT

A display device includes a solar cell unit contains an organic-inorganic hybrid perovskite compound and avalanching nano particles to absorb light of small energy and emit light of greater energy, so that a light conversion efficiency of a solar cell can be increased, and the solar cell unit includes an opening for opening sub-pixels and light emitted from the sub-pixels may be emitted to the outside through the opening, so that a decrease in light transmittance caused by the solar cell can be reduced and light transmittance of the display device can be increased.

12 Claims, 10 Drawing Sheets

1

(56)         References Cited

U.S. PATENT DOCUMENTS

| | | | | |
|---|---|---|---|---|
| 2014/0225090 A1* | 8/2014 | Lee | ........................ | H10K 71/00 |
| | | | | 257/40 |
| 2015/0261333 A1 | 9/2015 | Kaneyasu et al. | | |
| 2015/0295194 A1* | 10/2015 | Kanatzidis | ............. | H10K 85/00 |
| | | | | 136/263 |
| 2015/0340632 A1* | 11/2015 | Etgar | ..................... | H10K 85/00 |
| | | | | 438/93 |
| 2017/0084668 A1 | 3/2017 | Wang et al. | | |
| 2021/0265591 A1 | 8/2021 | Matsuda et al. | | |

FOREIGN PATENT DOCUMENTS

| | | | | | |
|---|---|---|---|---|---|
| CN | 103666447 A | | 3/2014 | | |
| CN | 104793812 A | | 7/2015 | | |
| CN | 106981571 A | | 7/2017 | | |
| CN | 110174973 A | | 8/2019 | | |
| CN | 113061434 A | * | 7/2021 | ............. | H10F 77/45 |
| KR | 10-2014-0101479 A | | 8/2014 | | |
| KR | 10-2016-0050177 A | | 5/2016 | | |
| KR | 102130331 B1 | | 7/2020 | | |
| KR | 20210056483 A | | 5/2021 | | |

OTHER PUBLICATIONS

Office Action in Chinese Appln. No. 202210979367.7 mailed on May 13, 2026, 17 pages (with English translation).

* cited by examiner

201

<u>235</u>

235a

235b

1

500
510
200
SP1
SP2
SP3
300
310

600
610

110
710
700

DISPLAY DEVICE

CROSS-REFERENCE TO RELATED APPLICATION

This application claims priority to and benefit of Korean Patent Application No. 10-2021-0187794 filed on Dec. 24, 2021, which is hereby incorporated by reference in its entirety.

BACKGROUND

Field of the Disclosure

The present disclosure is to provide a display device including a solar cell with increased light conversion efficiency and having high transmittance.

Description of the Background

A display device is implemented in a wide variety of types, such as a television, a monitor, a smart phone, a tablet PC, a laptop computer, and a wearable device.

The display device is operated by power. The power may be supplied via a wired connection or may be supplied via a charged battery.

In recent years, various types of portable display devices have been developed to increase portability. Thus, overcoming a battery capacity limit of the display device is one of important issues.

The higher the specification of the display device, the higher the power consumption. Accordingly, the required battery capacity also increases.

A size of a battery tends to be increased to increase a battery capacity of a display device. However, as the size of the battery increases, a thickness and a weight of the display device also increase.

Further, when power is supplied to the display device by the battery, the display device may be used within a limit of a charged amount. There is a need to efficiently increase a supplied amount of power beyond the battery capacity limit.

A solar cell may be introduced into the display device as a method for assisting the power supply to the display device.

Because the solar cell is able to convert solar energy into electricity, when the display device includes the solar cell, it is possible to supply the power to the display device beyond the battery capacity limit.

When a light receiving area of the solar cell increases, a light conversion efficiency may be increased.

In order to increase the light conversion efficiency of the solar cell, the solar cell may be formed on a front face of a display portion of the display device to increase the light receiving area capable of directly absorbing sunlight.

However, when the solar cell is formed on the front face of the display portion because the solar cell covers the display portion, transmittance of light emitted from the display portion is reduced by the solar cell, so that luminance of the display device is reduced.

That is, because the light conversion efficiency of the display device including the solar cell is in a trade-off relationship with the light transmittance of the display device, it is necessary to develop a display device capable of increasing both the light conversion efficiency and the light transmittance thereof including the solar cell.

In one example, the display device may include a touch sensor unit that operates by recognizing whether touch is performed.

For example, the touch sensor unit may be implemented as a touch sensor unit in a resistive scheme that recognizes whether the touch is performed by a pressing force, in a capacitive scheme that recognizes whether the touch is performed by a change in capacitance on a touch screen, or the like.

Among them, the touch sensor unit in the capacitive scheme may include touch electrodes capable of sensing the touch. The light transmittance of the display device may be affected by the touch electrodes.

Further, when the display device includes both the solar cell and the touch sensor unit, the sensing of the change in the capacitance by the touch electrodes is obstructed depending on an arrangement form of the solar cell, so that a performance of the touch electrode may be deteriorated.

The above information disclosed in this Background section is only for enhancement of understanding of the background of the described technology and therefore it may contain information that does not form prior art that is already known to a person of ordinary skill in the art.

SUMMARY

Accordingly, the present disclosure is to provide a display device including the solar cell and the touch sensor unit capable of increasing both the light conversion efficiency and the light transmittance and reducing the performance degradation of the touch electrode.

The present disclosure is also to provide a display device that can increase the light conversion efficiency of the solar cell.

The present disclosure is also to provide a display device that can increase the light transmittance of the display device while including the solar cell.

The present disclosure is also to provide a display device that can reduce the decrease in the light transmittance due to the touch electrode while including the solar cell.

The present disclosure is also to provide a display device that can reduce the performance degradation of the touch electrode by the solar cell while including the solar cell.

The present disclosure is also to provide a display device in which the solar cell may replace a polarizing plate.

The present disclosure is not limited to the above-mentioned and other advantages of the present disclosure that are not mentioned may be understood based on following descriptions, and may be more clearly understood based on aspects of the present disclosure. Further, it will be easily understood that advantages of the present disclosure may be realized using means shown in the claims and combinations thereof.

A display device according to an aspect of the present disclosure includes a display panel including a plurality of sub-pixels, a solar cell unit disposed on the display panel, wherein the solar cell unit includes a solar cell and an opening for opening the plurality of sub-pixels, and a touch sensor unit disposed on the display panel, and the solar cell may include a light absorption layer and the light absorption layer may contain an organic-inorganic hybrid perovskite compound.

Further, a display device according to an aspect of the present disclosure may include a display panel including a plurality of sub-pixels, a solar cell unit disposed on the display panel, wherein the solar cell unit includes a solar cell and a first opening for opening the plurality of sub-pixels, and a touch sensor unit disposed on the solar cell unit and including a touch electrode having a mesh pattern, and the sub-pixels may be positioned so as to overlap the first opening of the solar cell unit, and the touch electrode may be positioned so as not to overlap the first opening of the solar cell unit.

Further, a display device according to an aspect of the present disclosure may include a display panel including a plurality of sub-pixels, a touch sensor unit disposed on the display panel and including a touch electrode having a mesh pattern, and a solar cell unit disposed on the touch sensor unit, wherein the solar cell unit includes a solar cell, a first opening for opening the plurality of sub-pixels, and a second opening for opening at least a partial area of the touch electrode, and the sub-pixels may be positioned so as to overlap the first opening of the solar cell unit, and the touch electrode may be positioned so as to overlap the second opening.

According to an aspect of the present disclosure, the solar cell unit contains the organic-inorganic hybrid perovskite compound to absorb the light of the small energy and emit the light of the greater energy, so that the light conversion efficiency of the solar cell may be increased.

According to an aspect of the present disclosure, the solar cell unit includes that opens the sub-pixels and the light emitted from the sub-pixels may be emitted to the outside through the opening, so that the decrease in the light transmittance caused by the solar cell may be decreased and the light transmittance of the display device may be increased.

According to an aspect of the present disclosure, in the display device in which the touch sensor unit is located on the solar cell unit, the sub-pixels are positioned so as to overlap the first opening of the solar cell unit and the touch electrode is positioned so as not to overlap the first opening of the solar cell unit, so that the decrease in the light transmittance caused by the solar cell and the touch electrode may be reduced.

According to an aspect of the present disclosure, in the display device in which the solar cell unit is located on the touch sensor unit, the sub-pixels are positioned so as to overlap the first opening of the solar cell unit to reduce the decrease in the light transmittance caused by the solar cell, and the touch electrode is positioned so as to overlap the second opening of the solar cell unit to sense the change in the capacitance through the second opening, so that the degradation in the performance of the touch electrode caused by the solar cell may be reduced.

According to an aspect of the present disclosure, because in the solar cell unit, the solar cell may block the reflection of the external light and the opening may emit the light of the sub-pixels to the outside, the solar cell unit may function as the polarizing plate, so that the cost may be greatly reduced as the separate polarizing plate is not required.

Effects of the present disclosure are not limited to the above-mentioned effects, and other effects as not mentioned will be clearly understood by those skilled in the art from following descriptions.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1A:
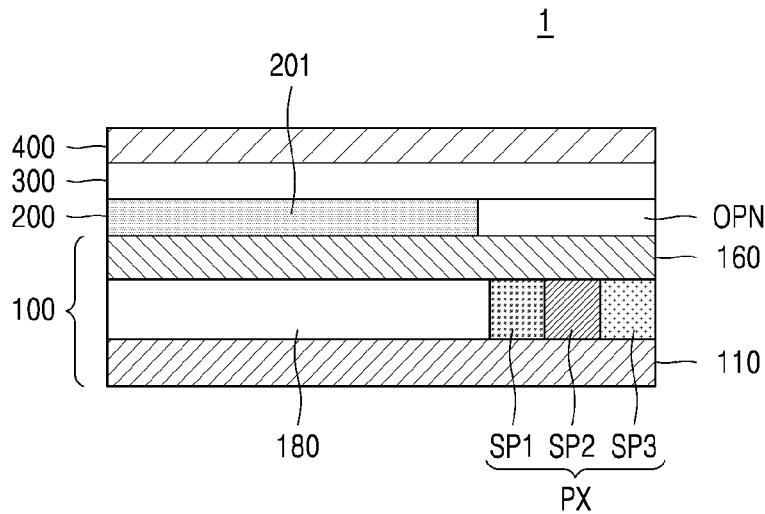
FIGS. 1A and 1B are cross-sectional views of a display device according to the present disclosure.

Advantages and features of the present disclosure, and a method of achieving the Advantages and features will become apparent with reference to aspects described later in detail together with the accompanying drawings. However, the present disclosure is not limited to the aspects as disclosed below, but may be implemented in various different forms. Thus, these aspects are set forth only to make the present disclosure complete, and to completely inform the scope of the disclosure to those of ordinary skill in the technical field to which the present disclosure belongs, and the present disclosure is only defined by the scope of the claims.

A shape, a size, a ratio, an angle, a number, etc. disclosed in the drawings for describing the aspects of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular aspects only and is not intended to be limiting of the present disclosure. As used herein, the singular constitutes "a" and "an" are intended to include the plural constitutes as well, unless the context clearly indicates otherwise. It will be further understood that the terms "comprise", "including", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is not indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various aspects of the present disclosure may be partially or entirely combined with each other, and may be technically associated with each other or operate with each other. The aspects may be implemented independently of each other and may be implemented together in an association relationship.

As used herein, the term "substantially," "about," and similar terms are used as terms of approximation, and are intended to account for inherent deviations in measured or calculated values that would be recognized by those of ordinary skill in the art. The term may be used to prevent unauthorized exploitation by an unauthorized infringer to design around accurate or absolute figures provided to help understand the present disclosure.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following, various components of a display device including a solar cell and a touch sensor unit that may increase both light conversion efficiency and light transmittance and reduce performance degradation of a touch electrode will be described in detail.

Figure 1B:
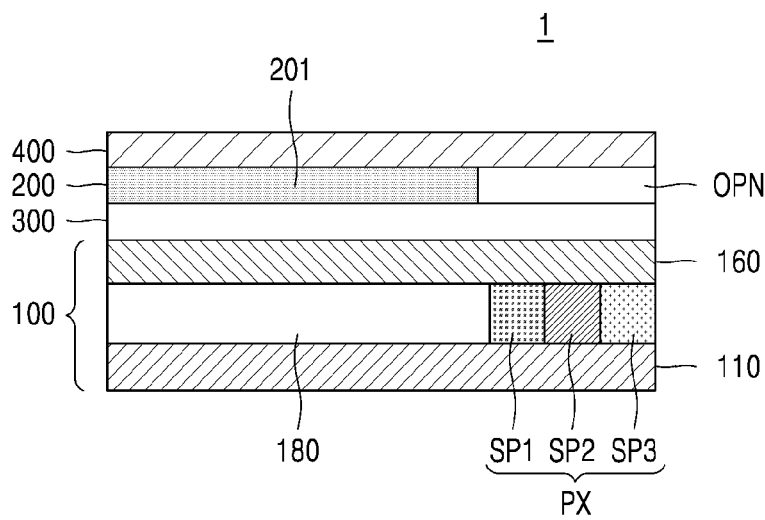

FIGS. 1A and 1B are cross-sectional views of a display device according to an aspect of the present disclosure.

Referring to FIGS. 1A and 1B, a display device 1 may include a display panel 100, a solar cell unit 200 disposed on the display panel 100, a touch sensor unit 300 disposed on the solar cell unit 200, and a cover 400 disposed on the touch sensor unit 300.

The display panel 100 may include a substrate 110, a plurality of sub-pixels SP1, SP2, and SP3 disposed on the substrate 110, and a sealing layer 160 for sealing the sub-pixels SP1, SP2, and SP3.

The display panel 100 may create an image to be implemented.

A type of the display panel 100 may not be limited, but the display panel 100 may be an organic light-emitting diode (OLED) display panel, a micro light-emitting diode display panel, or the like. Hereinafter, the display panel 100 will be described as the organic light-emitting diode display panel as an example.

The substrate 110 may be a base substrate of the display device 1. A substrate of a glass material may be used as the substrate 110, but the present disclosure may not be limited thereto, and a polyimide substrate having flexible properties may be used.

A plurality of pixels PX for displaying the image, and a wiring unit 180 including signal wirings for applying various signals to the pixels PX, semiconductor elements, and the like may be disposed on the substrate 110.

The plurality of pixels PX may be repeatedly arranged in a matrix form, and one pixel PX may include the plurality of sub-pixels SP1, SP2, and SP3.

For example, one pixel PX may include a first sub-pixel SP1, a second sub-pixel SP2, and a third sub-pixel SP3.

In this case, the first sub-pixel SP1 may be a sub-pixel having a color of red (R), the second sub-pixel SP2 is a sub-pixel having a color of green (G), and the third sub-pixel SP3 may be a sub-pixel having a color of blue (B).

Further, for example, one pixel PX may include the first sub-pixel SP1, the second sub-pixel SP2, the third sub-pixel SP3, and a fourth sub-pixel SP4.

The first sub-pixel SP1 may be the sub-pixel having the color of red (R), the second sub-pixel SP2 may be the sub-pixel having the color of green (G), the third sub-pixel SP3 may be the sub-pixel having the color of blue (B), and the fourth sub-pixel SP4 may be a sub-pixel having a color of white (W).

Each sub-pixel may include a light-emitting element, and the light-emitting element may be an organic light-emitting element.

The organic light-emitting element may be implemented to emit light of the same color, such as white light, for each pixel or to emit light of a different color for each pixel, such as red, green, or blue light.

The sealing layer 160 may be disposed on the plurality of sub-pixels SP1, SP2, and SP3.

The sealing layer 160 may be composed of a plurality of layers in which one or more organic material layers and/or inorganic material layers are alternately stacked, thereby reducing penetration of moisture or foreign substances into the light-emitting element.

The solar cell unit 200 may be disposed on the display panel 100, and may include a solar cell 201 and an opening OPN for opening the plurality of sub-pixels SP1, SP2, and SP3.

In order to increase a light conversion efficiency of the solar cell unit 200, the solar cell unit 200 may increase a light receiving area directly irradiated with sunlight.

In order to increase the light receiving area, the solar cell unit 200 may be disposed to cover a front face of the display panel 100 including the plurality of sub-pixels SP1, SP2, and SP3.

However, when the solar cell 201 of the solar cell unit 200 is disposed to overlap the plurality of sub-pixels SP1, SP2, and SP3, the light of the light-emitting element is difficult to be radiated to the outside due to the solar cell 201, which may lead to a decrease in luminance resulted from a decrease in transmittance of the display device 1.

Therefore, the solar cell unit 200 may include the opening OPN that opens the plurality of sub-pixels SP1, SP2, and SP3 to be exposed to the outside.

For example, the opening OPN of the solar cell unit 200 may be defined in a form of a hole extending in a pattern corresponding to the sub-pixels SP1, SP2, and SP3, so that the light emitted from the sub-pixels SP1, SP2, and SP3 may be emitted to the outside without being blocked by the solar cell 201.

Accordingly, according to an aspect of the present disclosure, the solar cell unit 200 includes the opening OPN opens the plurality of sub-pixels SP1, SP2, and SP3 such that the plurality of sub-pixels SP1, SP2, and SP3 do not overlap the solar cell 201, thereby reducing the decrease in transmittance of the display device 1.

The touch sensor unit 300 operating by recognizing whether a touch is performed may be disposed on the solar cell unit 200.

FIG. 1A shows that the touch sensor unit 300 is disposed on the solar cell unit 200, but the present disclosure is not limited thereto. Referring to FIG. 1B, the solar cell unit 200 may be disposed on the touch sensor unit 300.

The cover 400 may be disposed on the touch sensor unit 300 or the solar cell unit 200.

For example, the cover 400 may include a cover window, and may protect the touch sensor unit 300, the solar cell unit 200, and the display panel 100 located below from damage due to an external impact and a scratch.

Figure 2A:
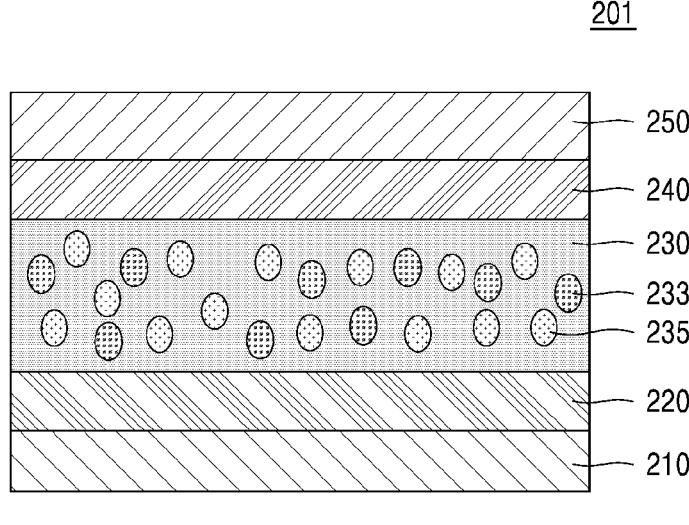
FIG. 2A is a cross-sectional view of a solar cell according to an aspect of the present disclosure.
Figure 2B:
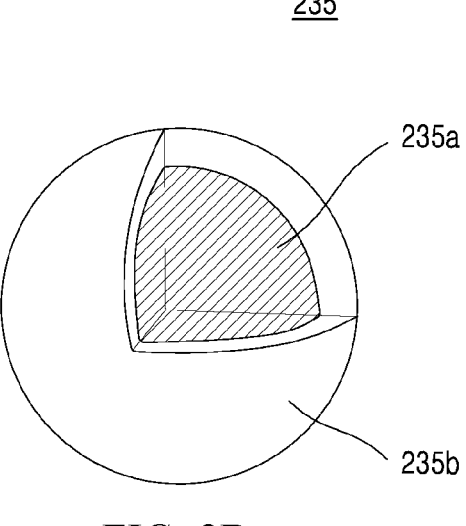
FIG. 2B shows avalanching nano particles according to the present disclosure.

FIG. 2B is a cross-sectional view of a solar cell according to an aspect of the present disclosure, and FIG. 2B shows avalanching nano particles according to an aspect of the present disclosure.

The solar cell 201 may include a first electrode 210, an electron transport layer 220, a light absorption layer 230, a hole transport layer 240, and a second electrode 250.

The first electrode 210 may be an anode and the second electrode 250 may be a cathode.

For example, when the display device is a bottom emission display device, the first electrode 210 may be a transparent electrode containing a conductive transparent material including one of fluorine doped tin oxide (FTO), indium zinc oxide (IZO), indium doped tin oxide (ITO), aluminum doped zinc oxide (AZO), and zinc oxide (ZnO), but the present disclosure may not be limited thereto.

Further, the second electrode 250 may contain one of aluminum (Al), silver (Ag), platinum (Pt), tungsten (W), copper (Cu), molybdenum (Mo), gold (Au), nickel (Ni), indium (In), ruthenium (Ru), rhodium (Rh), iridium (Ir), osmium (Os), and palladium (Pd), but the present disclosure may not be limited thereto.

As another example, when the display device is a top emission display device, the first electrode 210 may contain one of aluminum (Al), silver (Ag), platinum (Pt), tungsten (W), copper (Cu), molybdenum (Mo), gold (Au), nickel (Ni), indium (In), ruthenium (Ru), rhodium (Rh), iridium (Ir), osmium (Os), and palladium (Pd), but the present disclosure may not be limited thereto.

Further, the second electrode 250 may be a transparent electrode containing a conductive transparent material including one of fluorine doped tin oxide (FTO), indium zinc oxide (IZO), indium doped tin oxide (ITO), aluminum doped zinc oxide (AZO), and zinc oxide (ZnO), but the present disclosure may not be limited thereto.

Accordingly, the transparent electrode may be disposed on a side where the light is emitted, so that external light may pass through the transparent electrode to reach the light absorption layer 230.

When the display device is the bottom emission display device, the electron transport layer 220 may be disposed between the first electrode 210 and the light absorption layer 230 and the hole transport layer 240 may be disposed between the second electrode 250 and the light absorption layer 230 to constitute a path through which electrons and holes may smoothly move. For example, the electron transport layer 220 may contain metal oxide including one of TiO2, SnO2, ZnO, Nb2O5, Ta2O5, WO3, W2O5, In2O3, Ga2O3, Nd2O3, PbO, and CdO, but the present disclosure may not be limited thereto.

Further, the hole transport layer 240 may contain a hole transport material including one of PCDTBT(poly [[9-(1-octylnonyl)-9H-carbazole-2,7-diyl]-2,5-thiophenediyl-2,1, 3-benzothiadizole-4,7-diyl-2,5-thiophenediyl), PFB(poly(9, 9'-dioctylfluorene-co-bis(N,N'-(4,butylphenyl))bis(N,N'-phenyl-1,4-phenylene)diamine), F8BT(poly(9,9'-dioctylfluorene-co-benzothiadiazole), PEDOT(poly(3,4-ethylenedioxythiophene)), and PEDOT:PSS(poly(3,4-ethylenedioxythiophene)poly(styrenesulfonate), but the present disclosure may not be limited thereto.

However, when the display device is the top emission display device, the positions of the electron transport layer and the hole transport layer are exchanged with each other, so that the hole transport layer 240 may be disposed between the first electrode 210 and the light absorption layer 230 and the electron transport layer 220 may be disposed between the second electrode 250 and the light absorption layer 230 to constitute a path through which the electrons and the holes may smoothly move.

The light absorption layer 230 may contain an organic-inorganic hybrid perovskite compound 233 and avalanching nano particles (ANP) 235.

The organic-inorganic hybrid perovskite compound 233 may be a material having a chemical formula of $AMX_3$ in which A is an organic cation, M is a metal cation, and X is a halogen anion, and having a perovskite structure.

For example, A may be at least one organic cation selected from a group consisting of a monovalent organic ammonium ion and an amidinium group ion, but the present disclosure may not be limited thereto.

Further, M may be a divalent metal ion including one of $CU^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, but the present disclosure may not be limited thereto.

Further, X may be halogen anion of one of $F^-$, $Cl^-$, $Br^-$, and $I^-$, but the present disclosure may not be limited thereto.

An organic-inorganic hybrid perovskite solar cell may refer to a solid-state solar cell in which the material constituting the light absorption layer 230 is based on the organic-inorganic hybrid perovskite compound.

The organic-inorganic hybrid perovskite solar cell may prevent a loss occurring in a process in which a perovskite material itself accumulates photocharges and separates the charges, thereby having a high light conversion efficiency compared to a solar cell of a silicon material.

The light conversion efficiency refers to a ratio of solar energy incident on the solar cell to electrical energy outputted, and is an index indicating a rate at which the solar cell converts the light into the electricity.

Further, the organic-inorganic hybrid perovskite solar cell has an advantage that a low-temperature process is possible because it does not require a high-temperature heat treatment compared to the solar cell of the silicon material.

For example, the organic-inorganic hybrid perovskite solar cell may be formed by a process of mixing a starting material composed of a cation and an anion into a solution to form a mixture and coating the mixture, thereby having an advantage of economic feasibility and ease of the manufacturing process.

As such, according to an aspect of the present disclosure, because the light absorption layer 230 of the solar cell 201 contains the organic-inorganic hybrid perovskite compound 233, the solar cell 201 having the relatively high light conversion efficiency may be constructed.

In one example, according to an aspect of the present disclosure, the light absorption layer 230 of the solar cell 201 may contain the avalanching nano particles 235 in addition to the organic-inorganic hybrid perovskite compound 233.

The nanoparticles described in the present disclosure mean particles whose size is in nanometer units, and mean particles having one of a width, a length, and a vertical dimension equal to or smaller than 100 nm.

Unlike down-conversion in which, after light with great energy is absorbed into a material, a portion of the energy is consumed as thermal energy and the remaining small energy is converted back to the light and emitted, in up-conversion nanoparticles, rays of light of small energy are absorbed multiple times and coupled to each other to be converted into light with great energy and emitted.

Therefore, because the up-conversion nanoparticles are able to use infrared light with small energy as a light source, the up-conversion nanoparticles may absorb long-wavelength infrared light rays of small energy, which are invisible to the eye, and convert the rays into short-wavelength light of great energy, such as visible light.

The avalanching nano particles 235 are particles that may increase the light conversion efficiency equal to or lower than 1% of general up-conversion nanoparticles to about 40%.

The avalanching nano particles 235 may generate a photon avalanche phenomenon of the light by chain amplification of the light.

The avalanche phenomenon refers to a phenomenon in which the rays of light are absorbed into the nanoparticle multiple times, then the rays cause the chain optical amplification reaction, for example, an avalanche or a landslide, in an atomic lattice structure constituting the nanoparticle to amplify an intensity thereof, and then, the rays are emitted from the nanoparticle multiple times.

The avalanching nano particle 235 may have a core-shell structure including a core 235a containing a nanoparticle doped with thulium ($Tm^{+3}$), and an inert shell 235b surrounding the core 235a.

For example, the inert shell 235b may contain a NaYF4 fluoride-based compound doped with $Nd^{3+}$ and $Yb^{3+}$ but the present disclosure may not be limited thereto.

An ion doping concentration of thulium doped in the core 235a may be equal to or higher than 8%. In this case, the avalanching nano particles 235 containing the thulium may emit light of greater energy with strong intensity by causing the chain amplification reaction inside the particle even when irradiated with light of small energy with weak intensity.

As the light absorption layer 230 of the solar cell 201 contains the avalanching nano particles 235 in addition to the organic-inorganic hybrid perovskite compound 233, the solar cell 201 having a light conversion efficiency 5% or more higher than that of a case of containing only the organic-inorganic hybrid perovskite compound 233 may be constituted.

As such, according to an aspect of the present disclosure, because the light absorption layer 230 of the solar cell 201 contains the avalanching nano particles 235 in addition to the organic-inorganic hybrid perovskite compound 233, the solar cell 201 having the relatively higher light conversion efficiency may be constituted, so that an active power of the display device 1 may be greatly increased.

Figure 3:
FIG. 3 is a plan view of a display device according to an aspect of the present disclosure.

FIG. 3 is a plan view of a display device according to an aspect of the present disclosure.

The display device 1 may include the display panel 100 including the plurality of sub-pixels SP1, SP2, and SP3, the solar cell unit 200 including the solar cell 201, and the touch sensor unit 300 including the touch electrode 310 having a mesh pattern.

Each of the sub-pixels SP1, SP2, and SP3 is located within the mesh pattern of the touch electrode 310 so as not to overlap the touch electrode 310, so that the light emitted from the sub-pixels SP1, SP2, and SP3 may be less interfered by the touch electrode 310.

Accordingly, the touch electrode 310 may be positioned to overlap the solar cell 201 of the solar cell unit 200.

A data driver 500, a gate driver 600, and a power supply 700 may be electrically connected to the display device 1.

The data driver 500 may be electrically connected to the display device 1 via a first wiring 510 including a data voltage (Vdata) wiring, a driving voltage (EVDD) wiring, a reference voltage (Vref) wiring, and a cathode wiring of the solar cell unit 200 to apply a signal and power to the display device 1.

The gate driver 600 may be electrically connected to the display device 1 via a second wiring 610 including a scan signal wiring and an anode wiring of the solar cell unit 200 to apply a signal and power to the display device 1.

The power supply 700 may be electrically connected to the display device 1 via a third wiring 710 including a base voltage (EVSS) wiring to apply power to the display device 1.

Figure 4A:
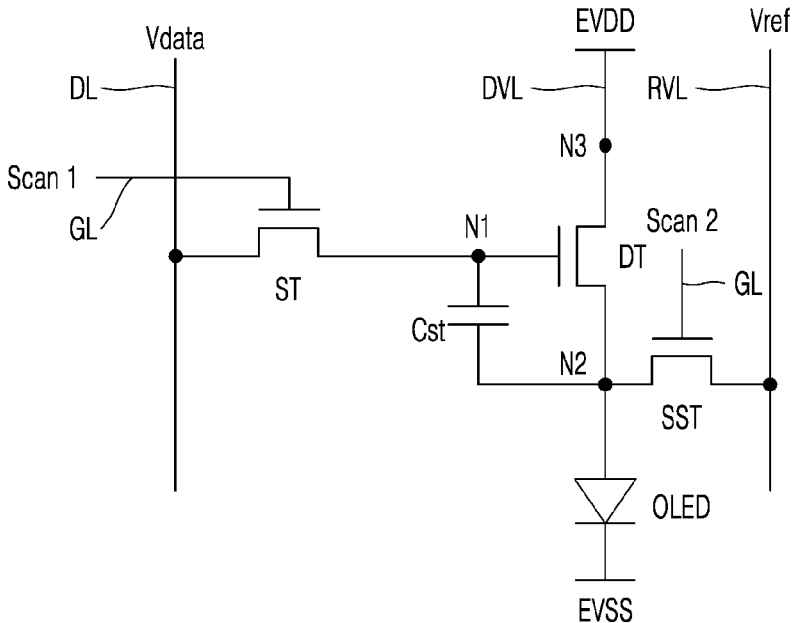
FIG. 4A is a circuit diagram of a display device according to the present disclosure.

FIG. 4A is a circuit diagram of one sub-pixel of a display device according to an aspect of the present disclosure.

The sub-pixel SP1 of the display device 1 according to an aspect of the present disclosure may include at least one transistor and a capacitor, and the organic light-emitting diode OLED may be disposed as the light-emitting element.

For example, the sub-pixel SP1 may include a driving transistor DT, a switching transistor ST, a sensing transistor SST, a storage capacitor Cst, and the organic light-emitting diode OLED.

The driving transistor DT may have a first node N1, a second node N2, and a third node N3.

The first node N1 of the driving transistor DT may be a gate node to which a data voltage Vdata is applied via a data line DL when the switching transistor ST is turned on.

The second node N2 of the driving transistor DT may be electrically connected to an anode of the organic light-emitting diode OLED, and may be a source node or a drain node.

The third node N3 of the driving transistor DT may be electrically connected to a driving voltage line DVL to which a driving voltage EVDD is applied, and may be a drain node or a source node.

The switching transistor ST may be electrically connected to the first node N1 of the driving transistor DT and the data line DL by being interposed therebetween and may operate in response to a scan signal SCAN1 supplied through the gate line GL as the gate line GL is connected to the gate node.

Further, when the switching transistor ST is turned on, the data voltage Vdata supplied via the data line DL is transferred to the gate node of the driving transistor DT, so that the operation of the driving transistor DT is controlled.

The sensing transistor SST may be electrically connected to the second node N2 of the driving transistor DT and the reference voltage line RVL by being interposed therebetween and may operate in response to a scan signal SCAN2 supplied through the gate line GL as the gate line GL is connected to the gate node.

When the sensing transistor SST is turned on, the reference voltage Vref supplied via the reference voltage line RVL may be transmitted to the second node N2 of the driving transistor DT.

That is, by controlling the switching transistor ST and the sensing transistor SST, the voltage of the first node N1 and the voltage of the second node N2 of the driving transistor DT may be controlled, and thus, current for driving the organic light-emitting diode OLED may be supplied.

The storage capacitor Cst may be electrically connected to the first node N1 and the second node N2 of the driving transistor DT by being interposed therebetween, and maintains the data voltage Vdata for one frame.

The storage capacitor Cst may be connected to the first node N1 and the third node N3 of the driving transistor DT by being interposed therebetween depending on a type of the driving transistor DT.

The anode of the organic light-emitting diode OLED may be electrically connected to the second node N2 of the driving transistor DT, and a base voltage EVSS may be applied to the cathode of the organic light-emitting diode OLED.

The base voltage EVSS may be a ground voltage or a voltage higher or lower than the ground voltage. Further, the base voltage EVSS may vary depending on a driving state.

Figure 4B:
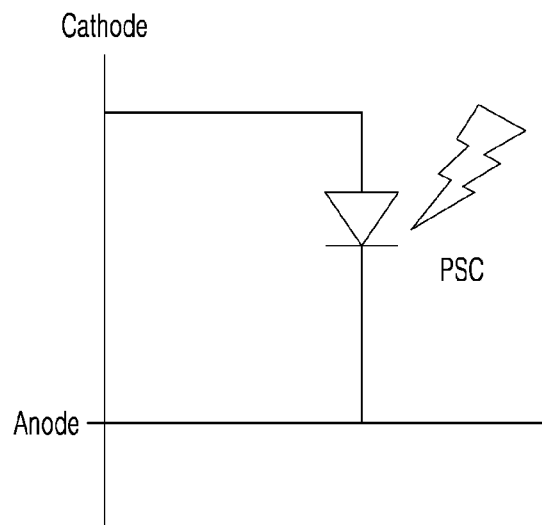
FIG. 4B is a circuit diagram of a solar cell according to the present disclosure.

FIG. 4B is a circuit diagram of a solar cell according to an aspect of the present disclosure.

When a light absorption layer PSC of the solar cell absorbs the sunlight, the electrons of a HOMO of the light absorption layer PSC may be transferred to a LUMO to form excitons.

Thereafter, the electrons may move to the electron transport layer along the LUMO and the holes resulted from the formation of the electrons may move to the hole transport layer along the HOMO, so that the electron and the hole of the electron-hole pair may be separated from each other.

The electron and the hole thus separated may respectively move to the anode and the cathode to cause the light conversion, thereby functioning as the solar cell.

Figure 5A:
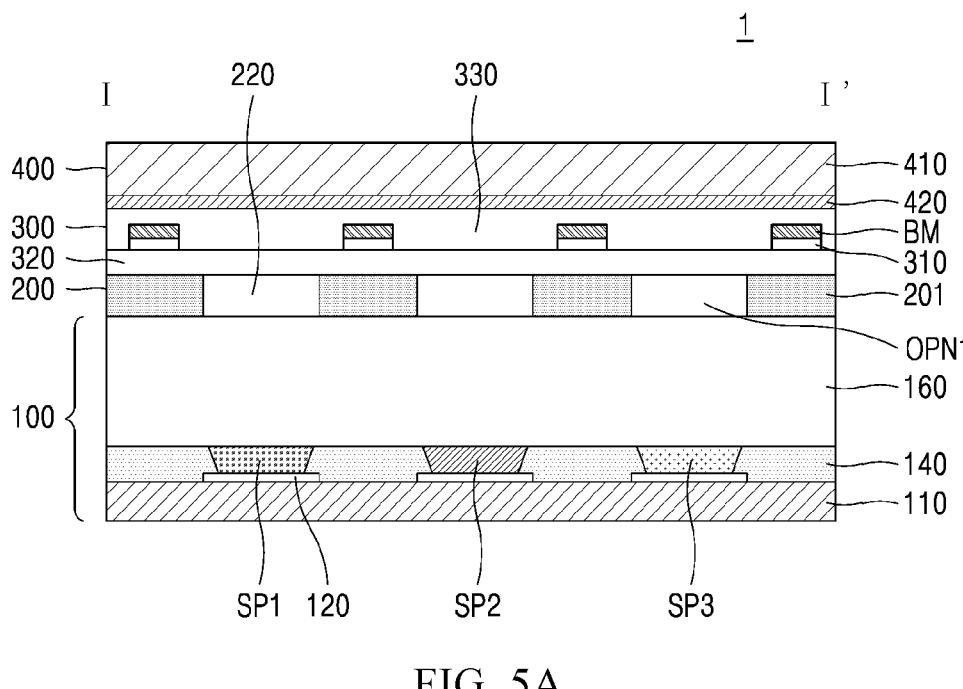
FIGS. 5A and 5B are cross-sectional views of a display device according to the present disclosure.
Figure 5B:
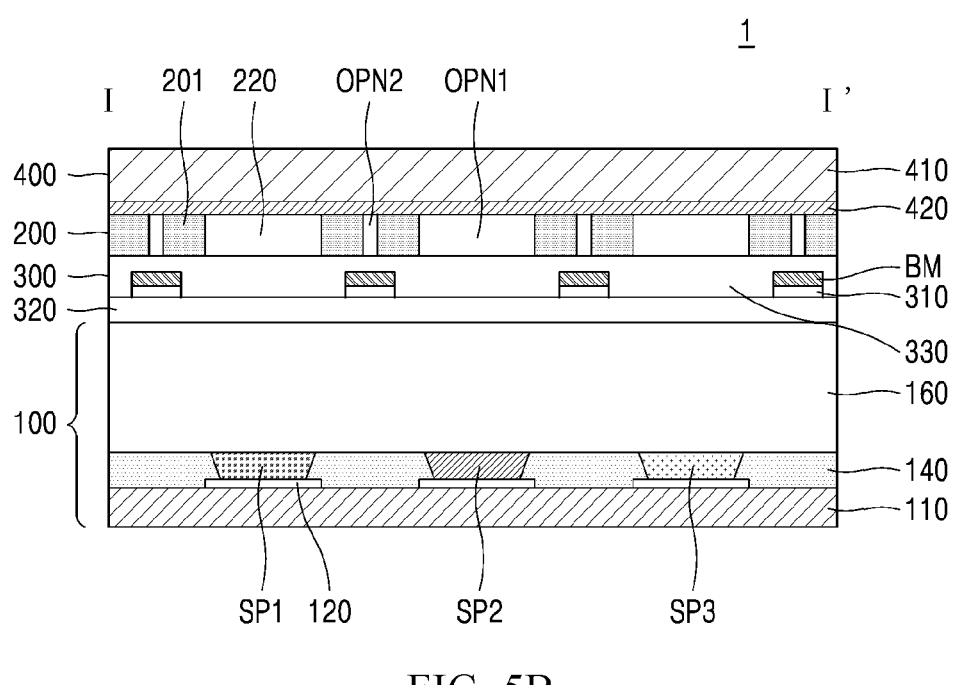

FIGS. 5A and 5B are cross-sectional views of a display device according to an aspect of the present disclosure.

Referring to FIG. 5A, the display device 1 may include the display panel 100 including the plurality of sub-pixels SP1, SP2, and SP3, the solar cell unit 200 disposed on the display panel 100 and including the solar cell 201 and a first opening OPN1 for opening the plurality of sub-pixels SP1, SP2, and SP3, and the touch sensor unit 300 disposed on the solar cell unit 200 and including the touch electrode 310 having the mesh pattern.

The display panel 100 may include the plurality of sub-pixels including the first sub-pixel SP1, the second sub-pixel SP2, and the third sub-pixel SP3, and areas of the plurality of sub-pixels may be divided from each other by a bank layer 140.

The bank layer 140 may have a pattern for opening areas corresponding to the plurality of sub-pixels SP1, SP2, and SP3.

The disposed pattern of the bank layer 140 of the display panel 100 may correspond to an arranged pattern of the solar cells 201 of the solar cell unit 200 disposed on the display panel 100.

For example, the pattern of the solar cells 201 may be formed to have a width the same as or smaller than the pattern of the bank layer 140 such that the light emitted from the plurality of sub-pixels SP1, SP2, and SP3 may be transmitted well through the first opening OPN1 of the solar cell unit 200.

Accordingly, a width of the first opening OPN1 of the solar cell unit 200 may be the same as or greater than that of the sub-pixels SP1, SP2, and SP3.

Therefore, according to an aspect of the present disclosure, the solar cell unit 200 may include the first opening OPN1 that opens the sub-pixels SP1, SP2, and SP3 and the light emitted from the sub-pixels SP1, SP2, and SP3 may be emitted to the outside through the first opening OPN1, so that the decrease in the light transmittance by the solar cell 201 may be reduced and the light transmittance of the display device 1 may be increased.

The sub-pixels SP1, SP2, and SP3 may be positioned to overlap the first opening OPN1 of the solar cell unit 200, and the touch electrode 310 may be positioned so as not to overlap the first opening OPN1 of the solar cell unit 200.

Therefore, according to an aspect of the present disclosure, in the display device 1 in which the touch sensor unit 300 is located on the solar cell unit 200, the sub-pixels SP1, SP2, and SP3 are positioned to overlap with the first opening OPN1 of the solar cell unit 200 and the touch electrode 310 is positioned so as not to overlap the first opening OPN1 of the solar cell unit 200, so that the decrease in the light transmittance by the solar cell 201 and the touch electrode 310 may be reduced.

A black matrix BM may be disposed on the touch electrode 310, and the black matrix BM may have a pattern corresponding to the mesh pattern of the touch electrode 310.

Because the touch electrode 310 is disposed on the solar cell unit 200, the external light may be reflected by the touch electrode 310, so that a reflectance of the display device 1 by the external light may increase.

Accordingly, according to the present disclosure, because the black matrix BM having the pattern corresponding to the mesh pattern of the touch electrode 310 may be placed on the touch electrode 310 and absorb the external light, the reflection of the external light by the touch electrode 310 disposed beneath the black matrix BM may be reduced.

Further, according to an aspect of the present disclosure, in the solar cell unit 200, the solar cell 201 may block the reflection of the external light and the first opening OPN1 may emit the light of the sub-pixels SP1, SP2, and SP3 to the outside, so that the solar cell unit 200 may function as the polarizing plate, thereby greatly reducing a cost because a separate polarizing plate is not required.

The cover 400 including a cover window 410 may be disposed on the touch sensor unit 300, and an anti-reflection film 420 may be disposed between the touch sensor unit 300 and the cover 400.

The anti-reflection film 420 is an optical-tunable film for maintaining the high luminance while reducing the reflectance of the external light. An optically transparent film may be used as the anti-reflection film 420.

Therefore, according to an aspect of the present disclosure, the anti-reflection film 420 may further reduce the reflectance of the external light such that the solar cell unit 200 may function as the polarizing plate without the separate polarizing plate.

Referring to FIG. 5B, the display device 1 may include the display panel 100 including the plurality of sub-pixels SP1, SP2, and SP3, the touch sensor unit 300 disposed on the display panel 100 and including the touch electrode 310 having the mesh pattern, and the solar cell unit 200 disposed on the touch sensor unit 300 and including the solar cell 201, the first opening OPN1 for opening the plurality of sub-pixels SP1, SP2, and SP3, and the second opening OPN2 for opening at least a partial area of the touch electrode 310.

The sub-pixels SP1, SP2, and SP3 may be positioned to overlap the first opening OPN1 of the solar cell unit 200, and the touch electrode 310 may be positioned to overlap the second opening OPN2 of the solar cell unit 200.

When the solar cell unit 200 is disposed on the touch sensor unit 300, a touch capacitor Ct that may sense whether the user has performed the touch may not be recognized properly when the touch electrode of the touch sensor unit 300 is not exposed to the outside by the solar cell unit 200.

Figure 6:
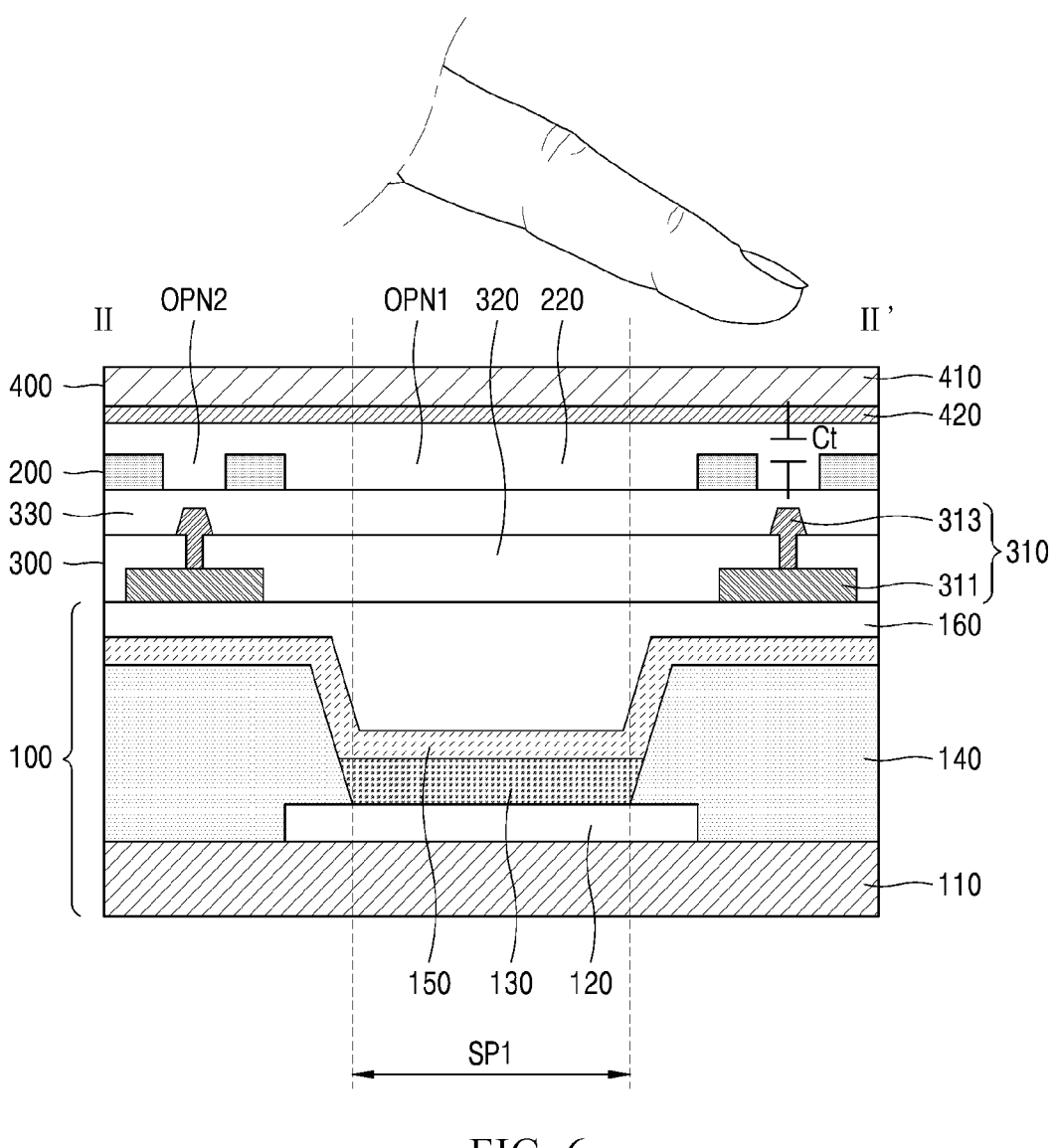
FIG. 6 is a cross-sectional view of a display device according to an aspect of the present disclosure.

In this regard, a description will be made with reference to FIG. 6 illustrating one sub-pixel.

The display panel 100 may include the substrate 110, an anode 120, a light-emitting layer 130, and a cathode 150, and may include the bank layer 140 that divides the sub-pixel areas from each other and the sealing layer 160 that protects the light-emitting layer 130.

An area where the anode 120, the light-emitting layer 130, and the cathode 150 overlap each other may be defined as the sub-pixel SP, and light from the light-emitting layer 130 may be emitted from an area of the sub-pixel SP.

The touch sensor unit 300 may be disposed on the display panel 100.

The touch sensor unit 300 may include the touch electrode 310 including a sensor electrode 311 and a bridge electrode 313 capable of electrically connecting the sensor electrodes 311 to each other.

A first intermediate layer 320 may be disposed between the sensor electrode 311 and the bridge electrode 313, and an electrode protecting layer 330 may be disposed on the bridge electrode 313.

The solar cell unit 200 including the solar cell 201 may be disposed on the touch sensor unit 300, and the solar cell unit 200 may include the first opening OPN1 for opening the first sub-pixel SP1 and the second opening OPN2 for opening at least the partial area of the touch electrode 310.

In the solar cell unit 200, a second intermediate layer 220 may be disposed to cover the solar cell 201, and the anti-reflection film 420 and the cover 400 may be disposed on the solar cell unit 200.

For example, when the display device 1 is touched with a user's finger FNG or a touch structure, in order to sense the user's touch, the touch electrode 310 of the touch sensor unit 300 may sense whether the operation is performed through the touch capacitor Ct formed between the user's finger FNG and the touch electrode 310.

When the solar cell 201 is disposed to prevent the formation of the touch capacitor Ct between the user's finger and the touch electrode 310, a touch sensitivity of the touch sensor unit 300 may be greatly reduced.

Therefore, according to an aspect of the present disclosure, as the solar cell 201 is patterned such that solar cell unit 200 includes the second opening OPN2 which opens at least the partial area of touch electrode 310 including the bridge electrode 313 and the sensor electrode 311, the formation of the touch capacitor Ct that may be formed between the user's finger FNG and the touch electrode 310 may not be interfered, so that the touch sensitivity of the touch sensor unit 300 may not be reduced.

After all, according to an aspect of the present disclosure, in the display device 1 in which the solar cell unit 200 is located on the touch sensor unit 300, the sub-pixel SP1 may be positioned to overlap the first opening OPN1 of the solar cell unit 200 to reduce the decrease in the light transmittance caused by the solar cell 201 and the touch electrode 310 may be positioned to overlap the second opening OPN2 of the solar cell unit 200 to sense a change in capacitance change through the second opening OPN2, so that the degradation of the performance of the touch electrode 310 by the solar cell 201 may be reduced.

The display device according to an aspect of the present disclosure may be described as follows.

A display device according to an aspect of the present disclosure may include a display panel including a plurality of sub-pixels, a solar cell unit disposed on the display panel, wherein the solar cell unit includes a solar cell and an opening for opening the plurality of sub-pixels, and a touch sensor unit disposed on the display panel.

The solar cell may include a light absorption layer and the light absorption layer may comprise an organic-inorganic hybrid perovskite compound.

The solar cell may further contain avalanching nano particles.

The avalanching nano particle may have a core-shell structure including a core containing a thulium $(Tm^{+3})$-doped nanoparticle, and an inert shell surrounding the core.

The organic-inorganic hybrid perovskite compound may have a chemical formula of $AMX_3$, where, A may be an organic cation, M may be a metal cation, and X may be a halogen anion.

A display device according to an aspect of the present disclosure may include a display panel including a plurality of sub-pixels, a solar cell unit disposed on the display panel, wherein the solar cell unit includes a solar cell and a first opening for opening the plurality of sub-pixels, and a touch sensor unit disposed on the solar cell unit and including a touch electrode having a mesh pattern.

The sub-pixels may be positioned so as to overlap the first opening of the solar cell unit, and the touch electrode may be positioned so as not to overlap the first opening of the solar cell unit.

The sub-pixel may be located within the mesh pattern of the touch electrode, and the touch electrode may be positioned to overlap the solar cell.

A black matrix may be disposed on the touch electrode, and the black matrix may have a pattern corresponding to the mesh pattern of the touch electrode.

The solar cell may include a light absorption layer, and the light absorption layer may comprise an organic-inorganic hybrid perovskite compound and avalanching nano particles.

A cover may be disposed on the touch sensor unit, and an anti-reflection film may be disposed between the touch sensor unit and the cover.

A display device according to an aspect of the present disclosure may include a display panel including a plurality of sub-pixels, a touch sensor unit disposed on the display panel and including a touch electrode having a mesh pattern, and a solar cell unit disposed on the touch sensor unit, wherein the solar cell unit includes a solar cell, a first opening for opening the plurality of sub-pixels, and a second opening for opening at least a partial area of the touch electrode.

The sub-pixels may be positioned so as to overlap the first opening of the solar cell unit, and the touch electrode may be positioned so as to overlap the second opening.

The sub-pixel may be located within the mesh pattern of the touch electrode.

A black matrix may be disposed on the touch electrode, and the black matrix may have a pattern corresponding to the mesh pattern of the touch electrode.

The solar cell may include a light absorption layer, and the light absorption layer may comprise an organic-inorganic hybrid perovskite compound and avalanching nano particles.

A cover may be disposed on the solar cell unit, and an anti-reflection film may be disposed between the solar cell unit and the cover.

A scope of protection of the present disclosure should be construed by the scope of the claims, and all technical ideas within the scope equivalent thereto should be construed as being included in the scope of the present disclosure. Although the aspects of the present disclosure have been described in more detail with reference to the accompanying drawings, the present disclosure is not necessarily limited to these aspects. The present disclosure may be implemented in various modified manners within the scope not departing from the technical idea of the present disclosure. Accordingly, the aspects disclosed in the present disclosure are not intended to limit the technical idea of the present disclosure, but to describe the present disclosure. the scope of the technical idea of the present disclosure is not limited by the aspects. Therefore, it should be understood that the aspects as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A display device comprising:
   a display panel including a plurality of sub-pixels;
   a solar cell unit disposed on the display panel and including a solar cell and a first opening for opening the plurality of sub-pixels; and
   a touch sensor unit disposed on the solar cell unit and including a touch electrode having a mesh pattern,
   wherein the sub-pixels overlaps with the first opening of the solar cell unit, and the touch electrode does not overlap with the first opening of the solar cell unit.

2. The display device of claim 1, wherein the sub-pixel is located within the mesh pattern of the touch electrode, and wherein the touch electrode overlaps with the solar cell.

3. The display device of claim 1, further comprising a black matrix disposed on the touch electrode and having a pattern corresponding to the mesh pattern of the touch electrode.

4. The display device of claim 1, wherein the solar cell includes a light absorption layer that includes an organic-inorganic hybrid perovskite compound and avalanching nano particles.

5. The display device of claim 1, further comprising a cover disposed on the touch sensor unit.

6. The display device of claim 5, further comprising an anti-reflection film disposed between the touch sensor unit and the cover.

7. A display device comprising:
   a display panel including a plurality of sub-pixels;
   a touch sensor unit disposed on the display panel and including a touch electrode having a mesh pattern; and
   a solar cell unit disposed on the touch sensor unit and including a solar cell, a first opening for opening the plurality of sub-pixels and a second opening for opening at least a partial area of the touch electrode,
   wherein the sub-pixels overlaps with the first opening of the solar cell unit, and the touch electrode does not overlap with the second opening.

8. The display device of claim 7, wherein the sub-pixel is located within the mesh pattern of the touch electrode.

9. The display device of claim 7, further comprising a black matrix disposed on the touch electrode and having a pattern corresponding to the mesh pattern of the touch electrode.

10. The display device of claim 7, wherein the solar cell includes a light absorption layer that includes an organic-inorganic hybrid perovskite compound and avalanching nano particles.

11. The display device of claim 7, further comprising a cover disposed on the solar cell unit.

12. The display device of claim 11, further comprising an anti-reflection film disposed between the solar cell unit and the cover.

* * * * *